United States Patent
Smith

(10) Patent No.: US 10,830,709 B2
(45) Date of Patent: Nov. 10, 2020

(54) INTERFEROMETER WITH PIXELATED PHASE SHIFT MASK

(71) Applicant: ONTO INNOVATION INC., Wilmington, MA (US)

(72) Inventor: Nigel P. Smith, Beaverton, OR (US)

(73) Assignee: Onto Innovation Inc., Wilmington, MA (US)

( * ) Notice: Subject to any disclaimer, the term of this patent is extended or adjusted under 35 U.S.C. 154(b) by 0 days.

(21) Appl. No.: 16/197,929

(22) Filed: Nov. 21, 2018

(65) Prior Publication Data

US 2020/0103355 A1    Apr. 2, 2020

Related U.S. Application Data

(60) Provisional application No. 62/738,789, filed on Sep. 28, 2018, provisional application No. 62/739,574, filed on Oct. 1, 2018.

(51) Int. Cl.
*H01L 21/66*    (2006.01)
*G01N 21/95*    (2006.01)
(Continued)

(52) U.S. Cl.
CPC ..... *G01N 21/9501* (2013.01); *G01B 9/02011* (2013.01); *G01B 11/303* (2013.01);
(Continued)

(58) Field of Classification Search
CPC ......... H01L 22/00; H01L 22/10; H01L 22/12; H01L 22/20
See application file for complete search history.

(56) References Cited

U.S. PATENT DOCUMENTS

| 5,875,029 A | 2/1999 | Jann et al. |
| 6,295,382 B1 | 9/2001 | Karanovic |

(Continued)

FOREIGN PATENT DOCUMENTS

| CN | 1987660 A | 6/2007 |
| TW | I489083 | 6/2015 |

(Continued)

OTHER PUBLICATIONS

International Search Report and Written Opinion dated May 9, 2019 for PCT Application No. PCT/US2018/062823, filed Nov. 28, 2018.

(Continued)

*Primary Examiner* — Cuong Q Nguyen
(74) *Attorney, Agent, or Firm* — Paradice and Li LLP

(57) ABSTRACT

An interferometer uses a phase shift mask that includes an array of pixels that are aligned with a corresponding array of pixels of a detector. Each pixel in the phase shift mask is adapted to produce one of a number of predetermined phase shifts between a test beam and a reference beam. For example, the pixels may be linear polarizers or phase delay elements having one of the number of polarizer orientations or phase delays to produce the predetermined phase shifts between the test beam and the reference beam. The pixels in the phase shift mask are arranged in the array to include each of the predetermined phase shifts in repeating pixel groups in rows that are one column wide, columns that are one row high, or blocks of multiple rows and columns.

19 Claims, 9 Drawing Sheets

(51) Int. Cl.
    *G01N 21/88* (2006.01)
    *G01B 9/02* (2006.01)
    *G01B 11/30* (2006.01)
(52) U.S. Cl.
    CPC ......... *G01N 21/8806* (2013.01); *H01L 22/20* (2013.01); *G01N 2021/8848* (2013.01)

(56) References Cited

U.S. PATENT DOCUMENTS

| | | | |
|---|---|---|---|
| 6,747,697 | B1 | 6/2004 | Lin et al. |
| 7,230,717 | B2 | 6/2007 | Brock et al. |
| 7,463,765 | B2 | 12/2008 | Messina et al. |
| 7,532,318 | B2 | 5/2009 | Meeks et al. |
| 7,684,032 | B1 | 3/2010 | Meeks |
| 7,864,334 | B2 | 1/2011 | Jeong |
| 8,275,573 | B1 | 9/2012 | Schmit et al. |
| 9,013,688 | B2 | 4/2015 | Gutman |
| 9,235,885 | B2 | 1/2016 | Amzaleg et al. |
| 2004/0080754 | A1 | 4/2004 | Tobiason et al. |
| 2006/0067571 | A1 | 3/2006 | Onishi |
| 2008/0153105 | A1 | 6/2008 | Martin et al. |
| 2010/0309476 | A1 | 12/2010 | Millerd |
| 2016/0292840 | A1 | 10/2016 | Konecky |
| 2019/0304851 | A1* | 10/2019 | Smith .................. H01L 22/12 |

FOREIGN PATENT DOCUMENTS

| | | | |
|---|---|---|---|
| TW | 201732224 | A | 9/2017 |
| TW | 201819889 | A | 6/2018 |

OTHER PUBLICATIONS

Creath, Katherine, "Extended vertical range roughness measurements in non-ideal environments," Optical Manufacturing and Testing IX, SPIE, vol. 8126, No. 1, Sep. 26, 2011, pp. 1-11.
Larkin, Kieran G., "Efficient nonlinear algorithm for envelope detection in white light interferometry," J. Opt. Soc. Am. A/vol. 13, No. 4, Apr. 1996, pp. 832-843.
Brock, Neal J. et al, "A pixelated polarizer-based camera for instantaneous interferometric measurements," SPIE vol. 8160-32.
Kimbrough, Brad et al., "Dynamic surface roughness profiler," SPIE vol. 8126, 81260H-1.
U.S. Appl. No. 16/197,849, filed Nov. 21, 2018.
Tobin, Kenneth W., "Inspection in Semiconductor Manufacturing," Webster's Encyclopedia of Electrical and Electronic Engineering, vol. 10, pp. 242-262, Wiley & Sons, NY, NY, 1999.
U.S. Appl. No. 16/197,737, filed Nov. 21, 2018.

* cited by examiner

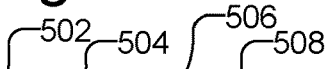
Fig. 5A
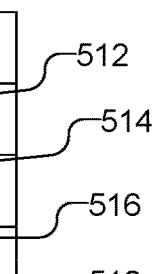
Fig. 5B
Fig. 5C

INTERFEROMETER WITH PIXELATED PHASE SHIFT MASK

CROSS REFERENCE TO RELATED APPLICATIONS

This application claims priority under 35 USC 119 to U.S. Provisional Application No. 62/738,789, entitled "OPTIMIZED PIXELATED PHASE MASK FOR WAFER DEFECT DETECTION," filed Sep. 28, 2018, and U.S. Provisional Application No. 62/739,574, entitled "OPTIMIZED PIXELATED PHASE MASK FOR WAFER DEFECT DETECTION," filed Oct. 1, 2018, both of which are incorporated herein by reference in their entireties.

FIELD OF THE INVENTION

The present invention is related to interferometry, and in particular to interferometry using optical phase difference.

BACKGROUND

Semiconductor and other similar industries, often use optical metrology equipment to provide non-contact evaluation of substrates during processing. Optical metrology is often used to determine one or more characteristics of a sample or features on the sample. Another type of evaluation of samples is defect inspection. Defects, such as particles or other irregularities on a sample, may interfere with the performance of resulting devices. Conventionally, optical tools used to detect defects use bright-field and dark-field inspection. Bright-field and dark-field detection tools detect defects based on the scattering of light caused by defects.

Interferometers are optical tools capable of measuring small height differences on an object by determining the phase of the interference signal at each pixel. Determining the phase of the signal requires obtaining more than one sample from each point on the wafer. In a conventional scanning interferometer, the phase is modified by moving the sample or reference surface along an axis perpendicular to the surface, typically in steps that produce a quarter-wave change in phase of the interferogram. Processing at least three such phase changes allows the signal phase and hence vertical location of the surface to be determined, at the expense of the time taken to acquire these samples.

SUMMARY

An interferometer uses a phase shift mask that includes an array of pixels that are aligned with a corresponding array of pixels of a detector. Each pixel in the phase shift mask is adapted to produce one of a number of predetermined phase shifts between a test beam and a reference beam. For example, the pixels may be linear polarizers or phase delay elements having one of the number of polarizer orientations or phase delays to produce the predetermined phase shifts between the test beam and the reference beam. The pixels in the phase shift mask are arranged in the array to include each of the predetermined phase shifts in repeating pixel groups in rows that are one column wide, columns that are one row high, or blocks of multiple rows and columns.

In one aspect, a phase shift interferometer includes a light source that produces an illumination beam; an interferometer objective lens system that directs a first portion of the illumination beam to be incident on a sample and receives a test beam reflected from the sample and directs a second portion of the illumination beam to be incident on a reference surface and receives a reference beam reflected from the reference surface, the test beam and reference beam combined to form a combined beam; a lens system that focuses the combined beam to produce an image of the sample; a phase mask positioned for either the combined beam or one of the reference beam or the test beam prior to being combined in the combined beam to pass through, the phase mask having an array of pixels, each pixel in the array of pixels being adapted to produce one of a number of predetermined phase shifts between the test beam and the reference beam in the combined beam, wherein the pixels in the array of pixels are arranged to include all of the predetermined phase shifts in repeating horizontal linear groups of pixels that are one column wide and repeating vertical linear groups of pixels that are one row high; a detector positioned in a plane of the image of the sample to receive the combined beam, the detector comprising an array of pixels aligned to the array of pixels of the phase mask and that receive the image of the sample that comprises interleaved interferograms that differ as a function of the predetermined phase shifts between the test beam and the reference beam in the combined beam and are grouped in repeating horizontal linear groups of pixels and repeating vertical linear groups of pixels; and at least one processor coupled to the detector, the at least one processor receiving signals for each pixel in the array of pixels in the detector and is configured to perform an interferometric measurement based on repeating groups of the interleaved interferograms.

In one aspect, a method of performing an interferometer measurement includes producing an illumination beam; splitting the illumination beam into a test beam that is incident on a sample and a reference beam that is incident on a reference surface; combining the test beam with the reference beam in a combined beam after being respectively reflected by the sample and the reference surface; focusing the combined beam to form an image of the sample; passing either the combined beam or one of the reference beam or the test beam prior to being combined in the combined beam through a phase mask having an array of pixels, each pixel in the array of pixels being adapted to produce one of a number of predetermined phase shifts between the test beam and the reference beam in the combined beam, wherein the pixels in the array of pixels are arranged to include all of the predetermined phase shifts in repeating horizontal linear groups of pixels that are one column wide and repeating vertical linear groups of pixels that are one row high; detecting the combined beam with a detector having an array of pixels aligned to the array of pixels of the phase mask and placed in a plane of the image of the sample to receive the image of the sample that comprises interleaved interferograms that differ as a function of the predetermined phase shifts between the test beam and the reference beam in the combined beam and are grouped in repeating horizontal linear groups of pixels and repeating vertical linear groups of pixels; performing the interferometric measurement on repeating groups of the interleaved interferograms; and communicating a signal to a process tool that causes the process tool to adjust a process parameter associated with a fabrication process step of the sample fabrication sequence based on the interferometric measurement.

In one implementation, a phase shift interferometer includes a light source that produces an illumination beam; an interferometer objective lens system that directs a first portion of the illumination beam to be incident on a sample and receives a test beam reflected from the sample and directs a second portion of the illumination beam to be incident on a reference surface and receives a reference beam reflected from the reference surface, the test beam and reference beam combined to form a combined beam; a lens system that focuses the combined beam to produce an image of the sample surface; a phase mask positioned for either the combined beam or one of the reference beam or the test beam prior to being combined in the combined beam to pass through, the phase mask having an array of pixels, each pixel being adapted to produce one of a number (N) of predetermined phase shifts between the test beam and the reference beam in the combined beam, wherein the pixels in the array of pixels are arranged to include all of the predetermined phase shifts in repeating horizontal linear groups of pixels that are one column wide, repeating vertical linear groups of pixels that are one row high, and repeating block groups of pixels that include pixels in multiple rows and columns; a detector positioned in the plane of the image of the sample surface to receive the combined beam, the detector comprising an array of pixels aligned to the array of pixels of the phase mask and that receive the image of the sample that comprises interleaved interferograms that differ as a function of the predetermined phase shifts between the test beam and the reference beam in the combined beam and are grouped in repeating horizontal linear groups of pixels, repeating vertical linear groups of pixels, and repeating block groups of pixels; and at least one processor coupled to the detector, the at least one processor receiving signals for each pixel in the array of pixels in the detector and is configured to select the interleaved interferograms grouped in the repeating horizontal linear groups of pixels, the repeating vertical linear groups of pixels, or the repeating block groups of pixels; and perform an interferometric measurement on the selected interleaved interferograms.

BRIEF DESCRIPTION OF THE DRAWINGS

FIGS. 5A-5G illustrates an arrangement of pixels in a phase shift mask and different arrangements of pixels having a number of phase shifts.

DETAILED DESCRIPTION

Figure 1:
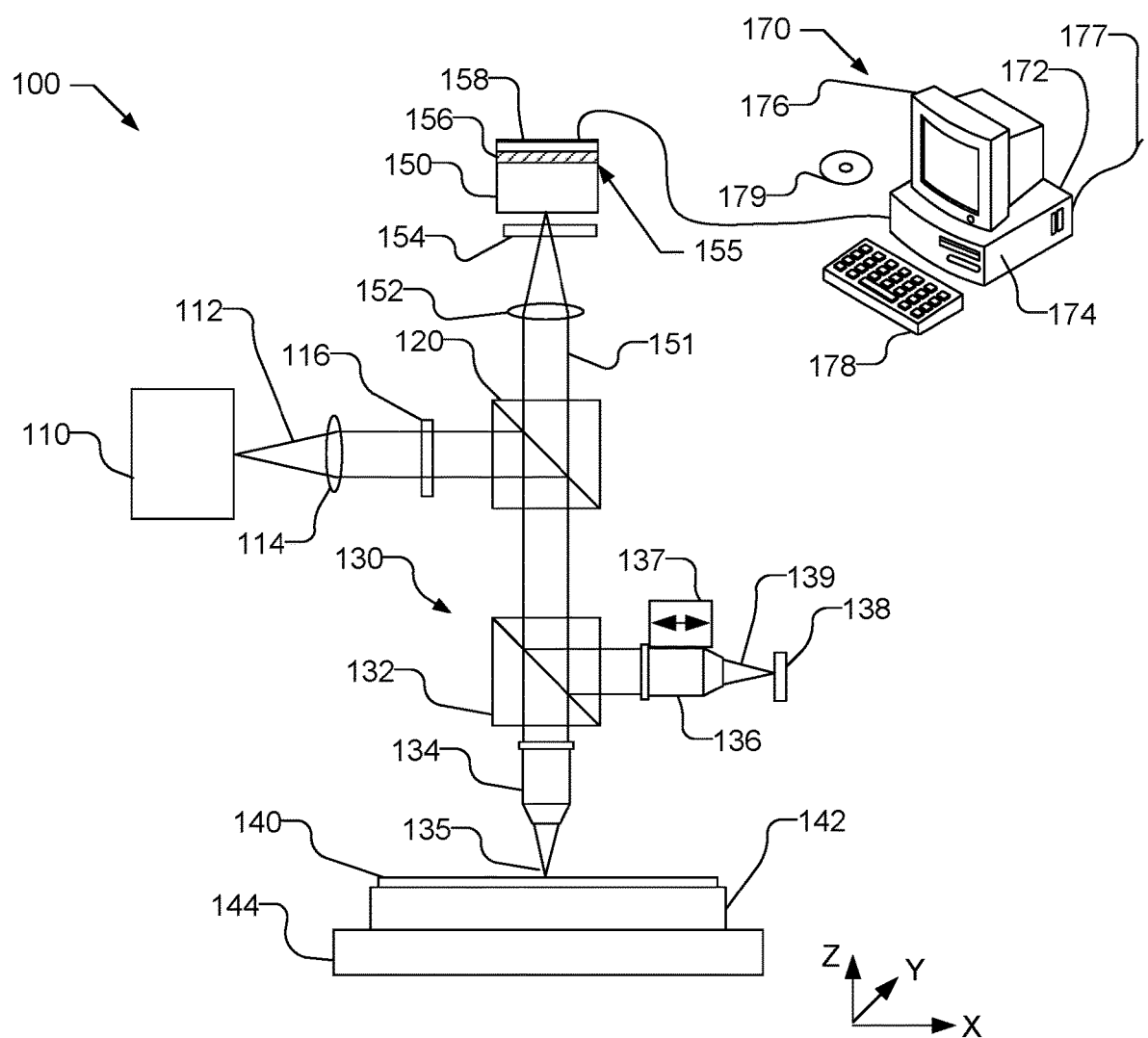
FIG. 1 illustrates a schematic view of an interferometer using a phase shift mask.

FIG. 1 illustrates a schematic view of an optical metrology device 100 that includes a phase mask to perform interferometric detection of sample surface topography from a single camera image. Optical metrology device 100 is illustrated as a phase shifting interferometer, and sometimes may be referred to herein as interferometer 100. With the use of a phase mask, the data may be obtained with a single exposure and thus, the time per acquisition is controlled by the time to move, focus and perform pattern recognition, and the image transfer rate. Additionally, by obtaining the data with a single exposure, the effects of vibration in all axes are reduced, especially those at low frequencies. The interferometer 100 may use a surface measurement to evaluate a sample, e.g., to determine one or more characteristics of the sample or a feature on the sample or to find a defect located on the sample.

A phase mask conventionally uses an array of repeating 2×2 blocks of pixels having different phase shifts, as illustrated in U.S. Pat. No. 7,230,717, which is incorporated herein in its entirety. The array of repeating 2×2 block of pixels throughout the phase mask allows the relatively fast measurement of the phase of an interferometric signal from a single image, and hence determination of surface topography with low contribution from vibration. The topography measurements may be used to determine characteristics of the sample or features on the sample or to detect defects by finding areas at the same intrafield location in multiple die that have different surface height relative to a reference.

The use of 2×2 pixel blocks in the phase mask array, however, means that the lateral resolution of the interferometer is at least twice the pixel size for even the best optical resolution. Moreover, analysis of a sample using a phase mask with repeating 2×2 blocks of pixels, assumes that there is a constant topography within each 2×2 pixel block. Accordingly, accurate measurement of topography from areas on the sample having a significant pattern frequency content, e.g., on the order of 1/pixel size, is not possible with a conventional phase mask array. Accordingly, improvements to the phase mask array, as discussed below, are desirable.

The interferometer 100 is illustrated as including a light source 110 to produce polarized light, an interferometric objective lens system 130 to produce orthogonally polarized test and reference beams and a camera 150 that includes a phase mask 155 in the form of a pixel-level micropolarizer array. The light source 110 in the interferometer 100 may be a narrow band light source that produces a desired wavelength of light, e.g., approximately 460 nm. The light source 110, for example, may be an LED, laser or incandescent source, such as a tungsten lamp, or a plasma source or arc lamp, or any other suitable high brightness light source. One or more appropriate filters may be used in conjunction with a light source with too great a bandwidth, though this design would be less efficient. By way of example, a light source, such as an LED, with 20 nm full width at half maximum (FWHM) bandwidth may be used. If desired, Kohler illumination, critical illumination, or other intermediate form of illumination or other distribution, such as annular, may be used, to produce an image of the light source 110 at the entrance pupil of an interferometric objective lens system 130, as long as the illumination scheme does not modify the interference behavior so that it cannot be interpreted. Light 112 from the light source 110 is focused by an illumination lens 114 on the back focal plane of the two objectives in the interferometric objective lens system 130, illustrated as being arranged in a Linnik configuration, after passing through one or more beam splitters 120, 132.

Light from the light source 110 passes through a polarizer 116, which may be, e.g., a linear polarizer, but in some embodiments may be a circular polarizer, and have variable orientation that is adjustable to maximize fringe contrast. The beam splitter 120, which may be a non-polarizing 50/50 beam splitter, directs, e.g., reflects, the polarized light to an interferometric objective lens system 130. Polarized light may be used, e.g., if the phase detector relies on polarization, but in other embodiments, e.g. where different materials or material thicknesses are used to introduce a phase lag, unpolarized light may be used.

The interferometric objective lens system 130 is configured to split incident light into a test beam that is reflected from the sample and a reference beam that is reflected from a reference surface and to recombine the reflected test beam from the sample with the reflected reference beam from the reference surface. The interferometric objective lens system 130 is illustrated, by way of example, as a Linnik geometry, but if desired, other interferometric objectives may be used, such as a Michelson or Mirau objective. The choice of objective may be restricted depending on the polarization state of light in the instrument.

The interferometric objective lens system 130 is illustrated as including a polarizing beam splitter 132, a sample objective 134 for imaging the surface of the test sample, and a complementary reference objective 136 and a reference mirror 138. The polarizing beam splitter 132 is used to separate the incident light between the two objectives 134 and 136 so that the polarization states are orthogonal between the sample and reference paths. The polarizing beam splitter 132 transmits light that is linearly polarized in the plane of the angled face of the beam splitter 132 and reflects light with the orthogonal polarization. Any form of polarizing beamsplitter may be used, examples with good efficiency include those with wire grid polarizing elements, or a MacNeille cube with an appropriate thin film coating at the internal angled face of the beamsplitter cube. The properties of the beam splitter 132 may be matched to the bandwidth of the light source 110, as a change in polarization efficiency with wavelength will change the balance of, or mix the polarization states of, light in the reflected and transmitted beams.

In the configuration of FIG. 1, light incident at the sample 140 and at the reference mirror 138, is linearly polarized. The linear polarizer 116 in the incident beam path may be used to change the proportion of light parallel to each polarization axis of the polarizing beam splitter 132, and so the relative strength of the beam in each path. Adjusting the linear polarizer in this way allows the intensity of the signal and reference beams to be brought to the same level, and hence generate the highest possible interference fringe contrast, which is desirable. This is an advantage as it allows the interferometer to be optimized for samples with varying reflectivity.

FIG. 1 illustrates an actuator 137 as attached to the reference objective 136 to move the reference objective 136 perpendicular to the vertical direction (Z axis) in order to vary the optical path difference between a test beam 135 incident on the sample 140 and a reference beam 139 incident on the reference mirror 138, which may be used, e.g., to focus the interferometer at a measurement location. The interferometer 100 captures all desired phase data in a single image and, accordingly, does not need to scan, e.g., vary the optical path difference to capture phase data, as in a scanning interferometer. In practice, the reference objective 136 alone, the reference mirror 138 alone, the sample, or the entire optical assembly of the interferometric objective lens system 130 may be moved along the optical axis to alter the optical path difference between the test beam and the reference beam. It should be understood, however, that with other interferometric objectives, the path difference may be varied by moving the reference mirror in a direction parallel to the vertical direction. From an optical perspective, there is no difference between the sample or the entire imaging system moving relative to each other; however, there are practical implications, i.e., the mass of the optical system may limit the selection of the stage which may in turn limit the minimum stage accuracy.

As illustrated, the test beam 135 from the sample objective 134 is incident on the sample 140, which is held on a chuck 142 mounted on a stage 144. The stage 144 is capable of horizontal motion in either Cartesian (i.e., X and Y) coordinates, or Polar (i.e., R and θ) coordinates or some combination of the two. The stage may also be capable of vertical motion along the Z coordinate.

The test beam 135 is reflected from the sample 140 and the resulting reflected beam passes back through the sample objective 134 and is combined with the reflected reference beam 139 by the polarizing beam splitter 132 to form a combined beam 151. Interference between the sample and reference beams occurs when the path difference variation between the sample and reference beam paths at all points is less than the coherence length of the light source.

The resulting combined beam 151 is directed, e.g., transmitted, by the beam splitter 120 towards the camera 150. It should be understood that if desired, the beam splitter 120 may transmit the illuminating light from the light source 110 and reflect the light reflected from the sample 140. It should also be understood that the beam splitter 132 need not be a polarizing beam splitter if a phase mask that relies on a method other than polarization is used to produce a shift in signal phase. For example, rather than using polarized light, unpolarized light may be used if a phase shift is produced in one of the beam paths, e.g., the reference beam 139 path, by placing a phase mask, with pixelated phase delay elements at the reference surface 138.

Figure 2:
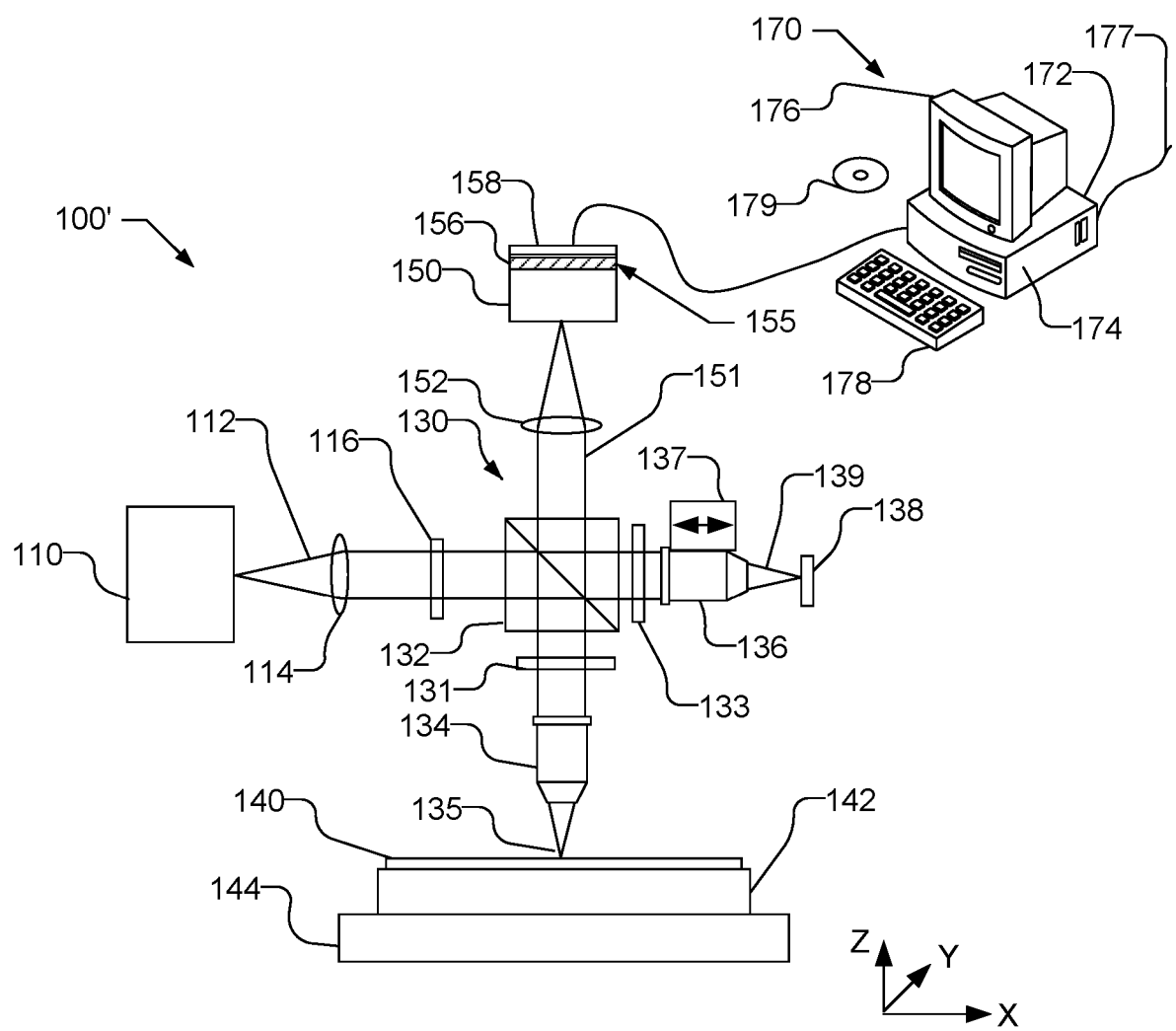
FIG. 2 illustrates a schematic view of another interferometer using a phase shift mask

FIG. 2 illustrates another configuration of an interferometer 100' that avoids the need for beam splitter 120 shown in FIG. 1 by using circularly polarized light. Interferometer 100' is similar to interferometer 100, shown in FIG. 1, like designated elements being the same. In the configuration of interferometer 100', shown in FIG. 2, circular polarizers 131 and 133 are positioned before sample objective 134 and reference objective 136 so that the light incident at the sample and reference surfaces is circularly polarized. The configuration of interferometer 100' in FIG. 2 allows the function of the non-polarizing beam splitter 120, shown in FIG. 1, to be replaced by the fourth face of the polarizing beam splitter 132. The configuration shown in FIG. 2 uses circularly polarized light in each of the sample and reference paths as each path must make one reflection and one transmission in the polarizing beam splitter 132, which advantageously balances the effect of any imbalance in the polarization efficiency of the polarizing beam splitter 132. Additionally, operating with circularly polarized light at the sample surface is an advantage when the sample is a semiconductor wafer, as the patterns on the wafers include many sets of lines that behave as linear polarizers and give rise to an orientation sensitivity of the instrument.

As illustrated in both FIG. 1 and FIG. 2, the combined beam is focused by a lens system, illustrated by lens 152, to produce an image of the sample at a plane that is coincident with the camera 150. As illustrated in FIG. 1, an output polarizer 154 may be positioned between the lens 152 and the camera 150, as the reflected beam consists of linearly polarized light. The polarization orientations of the light reflected from the sample 140 and from the reference mirror 138 are orthogonal. A circular polarizer 154, for example, a quarter wave plate, converts the orthogonally polarized beams into opposite direction circularly polarized light, e.g., the p-polarized test beam from the sample 140 is converted into right-hand circular polarization and the s-polarized reference beam from the reference mirror 138 is converted into left hand circular polarization. In the configuration of FIG. 2, the reflected beam is circularly polarized, but in opposite directions for the sample and reference signals, and thus, no output polarizer is required.

The camera 150 includes a phase mask 155 in the form of a pixel-level micropolarizer array 156 before a detector array 158, such as a CCD array, which are located in substantially the same image planes to receive the image of the sample from the lens system 152. The combined beams pass through the micropolarizer array 156 creating a number (N) of interleaved samples of the interference pattern on the detector array 158, with, e.g., the same magnitude of phase difference between each sample. Thus, the camera 150 receives an image of the sample combined with the reference signal, which, for a small path difference, creates an interferogram at each pixel in the camera 150. The different phase shift elements in the micropolarizer array 156 in the phase mask 155 produce an interleaved image of a number (N) of samples, each with the same phase shift, i.e. there are N different samples of the interferogram as function of phase. Groups of nearby samples (pixels) with different phase shifts may be processed together to obtain the local height. The processing may be performed using a number of pixels other than N, where the number and arrangement of pixels used for processing may be selected as discussed herein. The micropolarizer array 156, by way of example, includes an array of linear polarizers arranged in groups of four, with polarizer orientation 0°, 45°, 90° and 135°, that introduce a phase shift between the test and reference beams of twice the polarizer angle (reference). The micropolarizer array 156 and detector array 158 may be, e.g., a Phasecam manufactured by 4D Technologies using a wire grid polarizer array manufactured by Moxtek.

The interferometer 100 uses polarization data to determine a phase difference between the test beam 135 and the reference beam 139, which are orthogonally polarized by the polarizing beam splitter 132. The output polarizer 154, e.g., the quarter wave plate, converts the linearly polarized test beam 135 and reference beam 139 to left- and right-hand circular polarizations, which interfere after passing through the micropolarizer array 156. The detector array 158 receives the resulting light after interference and the intensity at each pixel in the detector array 158 is converted to an electrical charge.

The camera 150, e.g., the detector array 158, is coupled to a computer system 170, such as a workstation, a personal computer, central processing unit or other adequate computer system, or multiple systems. The computer system 170 is preferably included in, or is connected to or otherwise associated with interferometer 100. The computer system 170 may also control the movement of the stage 144, as well as control the operation of the chuck 142. The computer system 170 also collects and analyzes the interferometric data obtained from the camera 150 as discussed herein. For example, the computer system 170 may analyze the interferometric data to determine one or more physical characteristics of the sample 140, such as the presence of a defect, as discussed below. The computer system 170, which includes at least one processor 172 with memory 174, as well as a user interface including e.g., a display 176 and input devices 178. A non-transitory computer-usable storage medium 179 having computer-readable program code embodied may be used by the computer system 170 for causing the at least one processor to control the interferometer 100 and to perform the functions including the analysis described herein. The data structures and software code for automatically implementing one or more acts described in this detailed description can be implemented by one of ordinary skill in the art in light of the present disclosure and stored, e.g., on a non-transitory computer-usable storage medium 179, which may be any device or medium that can store code and/or data for use by a computer system such as processor 172. The computer-usable storage medium 179 may be, but is not limited to, magnetic and optical storage devices such as disk drives, magnetic tape, compact discs, and DVDs (digital versatile discs or digital video discs). A communication port 177 may also be used to receive instructions that are used to program the computer system 170 to perform any one or more of the functions described herein and may represent any type of communication connection, such as to the internet or any other computer network. The communication port 177 may further export signals, e.g., with measurement results and/or instructions, to another system, such as external process tools, in a feed forward or feedback process in order to adjust a process parameter associated with a fabrication process step of the samples based on the measurement results. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

Thus, the surface topography of the sample 140, characters of the sample 140, including the presence of one or more defects, including the size, position, type, etc., may be determined by the computer system 170 and may be communicated and stored in memory. The population of defects stored in memory may be used by yield engineers to drive yield improvements and control yield excursions. In another example, the surface topography of the sample 140, or characteristics of the sample 140, including the presence of one or more defects, including the size, position, type, etc., determined by computer system 170 may be communicated to a process tool that causes the process tool to adjust one or more process parameters associated with a fabrication process step of a semiconductor wafer fabrication sequence, e.g., of the sample 140 in a feed forward process, or subsequently processed samples in a feedback process, based on the measured surface topography or characteristics of the sample 140. In another example, the determined one or more physical characteristics of the sample 140, including the presence of one or more defects, including the size, position, type, etc., determined by computer system 170 may be communicated to cause at least a portion of the sample, e.g., a die of a wafer, to be rejected based on the presence of a defect. In some embodiments, an indication of the presence of a defect may be associated with the sample, or at least a portion of the sample, e.g., a die with a defect, and the indication of the presence of the defect may be recalled and used to reject the sample or portion of the sample, e.g., by excluding the sample or portion of the sample, from the finished lot at the completion of processing of the sample.

Figure 3A:
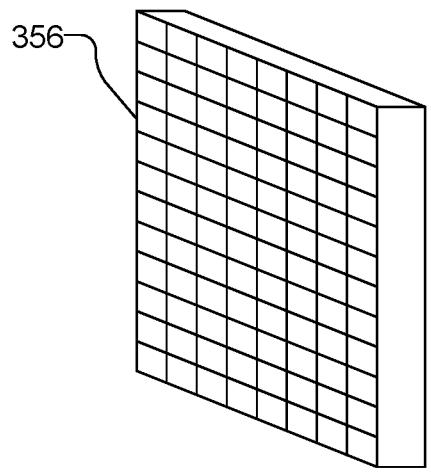
FIG. 3A illustrates a top plan view of a micropolarizer array that may be used with an interferometer.
Figure 3B:
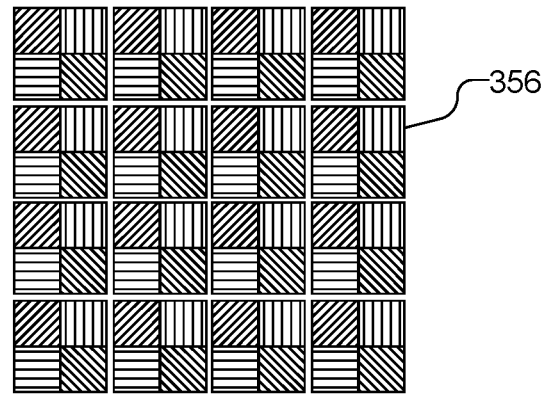
FIG. 3B illustrates a top plan view of a micropolarizer array that may be used with an interferometer.
Figure 3C:
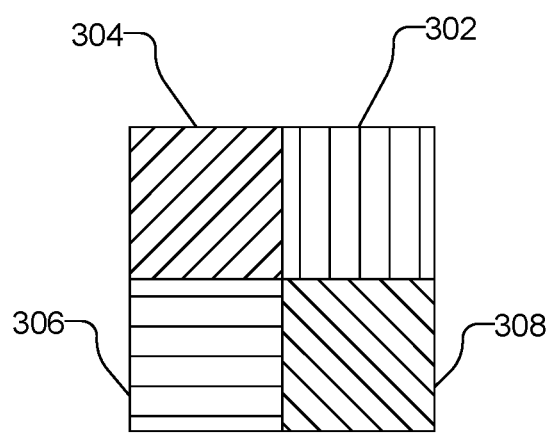
FIG. 3C illustrates a portion of a micropolarizer array that may be used with an interferometer.

FIGS. 3A and 3B illustrate a side perspective view and a top plan view of a conventional micropolarizer array 356. FIG. 3C illustrates a portion of the micropolarizer array 356 that includes a 2×2 array of polarizer pixels, 302, 304, 306, and 308 with four discrete polarizations (0°, 45°, 90°, 135°) that are repeated over the entire micropolarizer array 356, so that the micropolarizer array 356 includes a repeated array of micropolarizer pixels having discrete polarizations. When micropolarizer array 356 is used in the phase mask 155, the polarizer pixels 302, 304, 306, and 308 orientations at 0°, 45°, 90°, and 135° enable interference with phase lags of 0°, 90°, 180°, and 270°, respectively, between the test beam 135 and reference beam 139. The micropolarizer pixels have a size and spacing that match the size and spacing of the pixels in the detector array 158, so that each pixel in the detector array 158 is matched, i.e., aligned, with a micropolarizer element of the micropolarizer array 356.

Figure 3D:
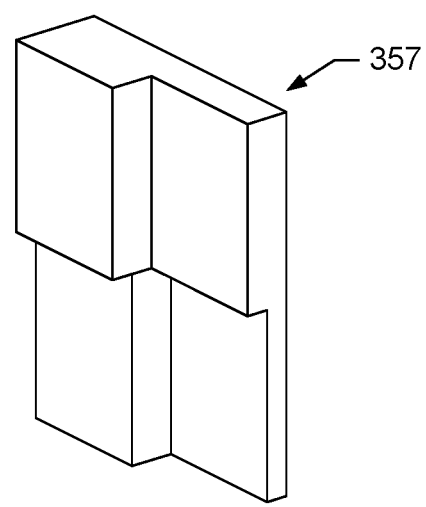
FIG. 3D illustrates a portion of a phase delay element.

Alternatively, in place of the micropolarizer array 356, a phase mask may be used that includes a repeated array of phase delay elements, a portion of one such array 357 being illustrated in perspective view in FIG. 3D. A phase mask with an array of phase delay elements may be a birefringent quartz mask etched to different depths in an array of squares matching the size and spacing of pixels in the detector array 158 and aligned with the detector array 158. With the use of phase delay pixels in the phase mask, polarized light may not be used in interferometers 100, 100', and the phase mask with phase delay pixels may be placed in, e.g., the reference beam 139 path at the reference surface 138, to produce the phase delay between the test beam 135 and the reference beam 139. Each one of the phase delay pixels introducing a potentially different delay between the reference and sample beams. The phase mask comprises a repeated array of phase delay elements having discrete phase delays that is aligned with the pixels of the detector array. Manufacturing techniques for such a mask are known in the semiconductor industry, where phase change is commonly used in photomasks for lithography. Depth control in each phase element may be improved by calibrating the phase delay at each pixel.

As illustrated in FIG. 3A-3D, a conventional micropolarizer array 356 or phase delay array 357 uses a 2×2 array of pixels with different phase delays, which is similar to that shown in U.S. Pat. No. 7,230,717, which is incorporated herein in its entirety. With the use of 2×2 pixel blocks, however, the lateral resolution of the interferometer is at least twice the pixel size for even the best optical resolution. Moreover, analysis of a sample using a phase mask with conventional 2×2 pixel blocks, assumes a constant topography within each 2×2 pixel block, as areas with significant pattern frequency content, e.g., of the order of 1/pixel size, cannot be measured with a conventional phase mask.

Figure 4A:
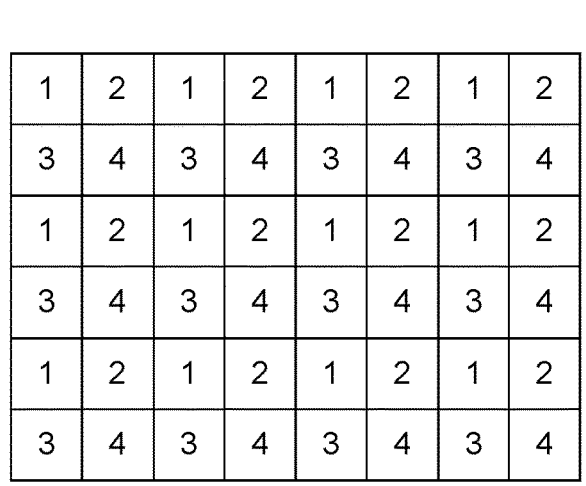
FIGS. 4A-4C illustrate a conventional arrangement of pixels in a phase shift mask.

FIG. 4A illustrates a conventional phase mask 400 with an array of 2×2 pixel blocks, as illustrated micropolarizer array 356 or phase delay array 357 in FIGS. 3A-3D. The number in the center of each pixel in the phase mask 400 represents the phase shift between a test beam and reference beam for that pixel, e.g., expressed as a multiple of 90°.

In operation, the signals $S_i$ (i=1, 2, 3, or 4) in the 2×2 blocks of pixels are received and used to calculate the surface height z, e.g., the average height for all pixels in a four pixel block, e.g., using:

$$z = \frac{\lambda}{4\pi} \tan^{-1}\left(\frac{S_1 - S_3}{S_2 - S_4}\right) \qquad \text{eq. 1}$$

It should be understood that the interferometer 100, 100' may produce interferometric measurements based on signals $S_i$ for each phase shift in a block of pixels in other ways.

Figure 4B:
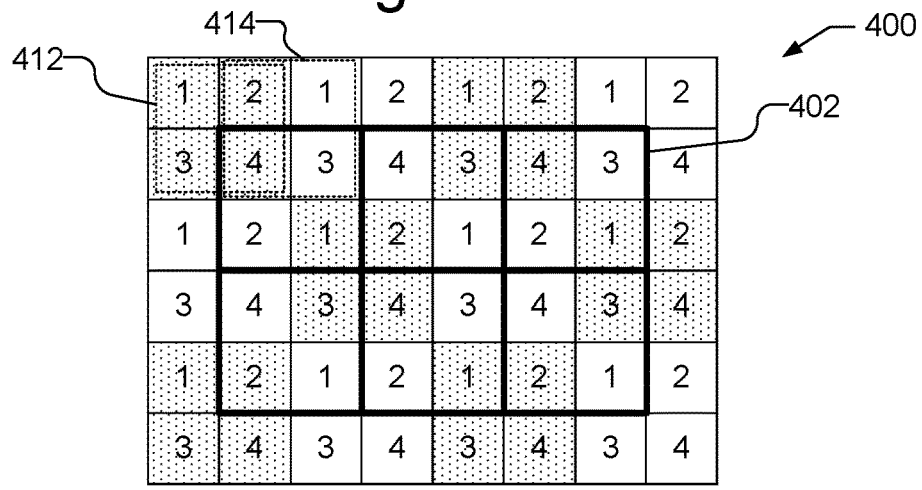

With the use of the conventional 2×2 block of pixels, as illustrated in FIG. 4A, a grouping of pixels with signals $S_i$ (i=1, 2, 3, or 4) is available at single pixel intervals. In other words, each pixel may be included in four different, but adjacent 2×2 blocks of pixels, assuming the pixel is not at an edge of the image. FIG. 4B, by way of example, illustrates the phase mask 400, but with different 2×2 groupings of pixels including i=1, 2, 3, and 4 illustrated with different shadings and also with thicker lines 402. It should be understood that the different shadings and thicker lines 402 illustrated in FIG. 4B are merely to more easily identify 2×2 groupings of pixels and are not part of the phase mask 400 itself. As can be seen in FIG. 4B, every pixel in the phase mask 400 is part of a 2×2 grouping of pixels each having different phase shifts.

While the conventional phase mask 400 allows the determination of the value of height z at single pixel spacing, the configuration of the phase mask 400 results in adjacent results using 50% of the same signal values. For example, measurement result obtained from a 2×2 group of pixels with dark shading, illustrated with dotted lines 412 in FIG. 4B, and a result taken another 2×2 group of pixels, illustrated with dotted lines 412, both use the same $S_2$ and $S_4$ signals, i.e., they use 50% of the same signal values.

The analysis of a sample using a phase mask requires that the nominal sample is unpatterned within each 2×2 pixel grouping, or the nominal sample has a continuous sub-resolution pattern in which there is no visible changes at dimensions of the size of a pixel in the phase mask.

Figure 4C:
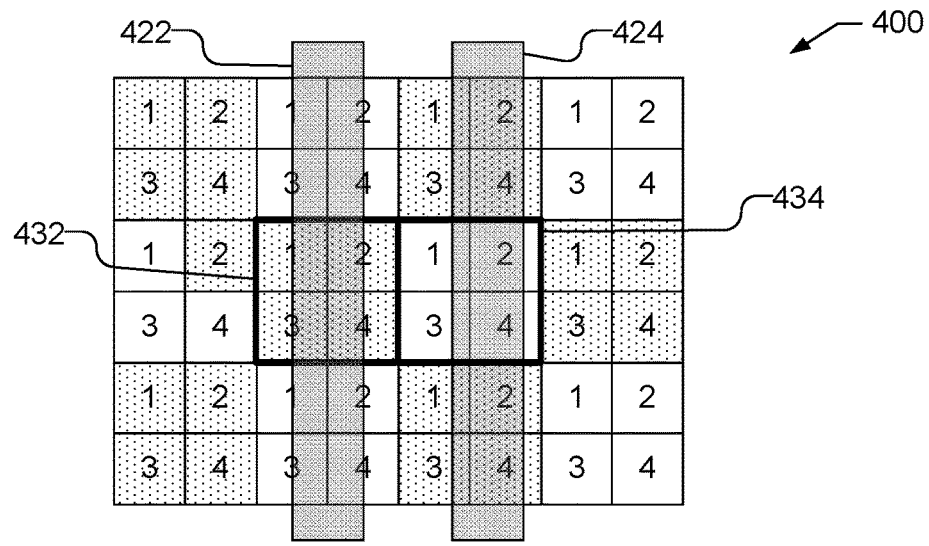

FIG. 4C illustrates the phase mask 400, similar to that shown in FIG. 4B, but superimposes resolved vertical lines 422 and 424 imaged from the sample, onto the phase mask 400. As can be seen in FIG. 4C, the presence of resolved vertical lines 422 and 424 means that the requirement that the sample is unpatterned or has a continuous sub-resolution pattern is not met. The vertical lines 422 and 424 represent changes in pattern density on the sample that are resolved by the tool. In the 2×2 block 432 illustrated with darker lines, the left side of vertical line 422 is imaged on pixels 1 and 3, while the right side of the same vertical line is imaged on pixels 2 and 4. The presence of vertical line 422 will change the signals so that equation 1 will not result in the correct surface height z. Moreover, signals are susceptible to even small movements perpendicular to the pattern direction. For example, vertical line 424 is illustrated as being primarily imaged in pixels 2 and 4 in the 2×2 block 434, with less of the vertical line 424 being imaged in pixels 1 and 3 of block 434. The differing amounts of the vertical line 424 will change the values of the signals produced by the pixels by differing amounts, resulting in an incorrect surface height.

Thus, with the conventional configuration of phase shifts in the phase mask 400, it is not possible to determine accurately the surface topography in areas with resolvable patterns, as illustrated by vertical lines 422 and 424, with pattern dimensions from approximately ½ to 4 times the pixel size. Moreover, if the area under a conventional 2×2 pixel block has a resolved pattern, the detection of a defect in the 2×2 pixel block may be difficult, because it may not be possible to determine whether a signal change is the result of the pattern or a sub-resolution defect.

FIG. 5A illustrates a portion of a phase mask 500 that improves on the above-described issues by arranging the pixels so that all discrete phase shifts are included in repeating pixel groups that are both rows that are one column wide and columns that are one row high. While phase mask 500 shows a specific arrangement of phase shifts, it should be understood that other arrangements of phase shifts having repeating pixel groups of all discrete phase shifts in both rows that are one column wide and columns that are one row high are contemplated. Moreover, the phase mask 500 includes repeating pixel groups that are in blocks that include pixels in multiple rows and columns. For example, in one implementation, where there are a number (N) of predetermined phase shifts in the phase mask 500, there are repeating vertical linear pixel groups, e.g., arranged vertically in single columns (1×N) pixel groups, and repeating horizontal linear pixels groups, e.g., arranged horizontally in single rows (N×1) pixel groups, in square blocks, e.g., arranged in square ($\sqrt{N}\times\sqrt{N}$) pixel groups, or other size blocks, e.g., arranged in block (n×m) pixel groups, where n=m, or n # m, and n=N or n≠N. The number in the center of each pixel in the phase mask 500 represents the phase shift between a test beam and reference beam for that pixel, e.g., expressed as a multiple of 90°. Unlike phase mask 400, which repeats the only two phase shifts horizontally in rows, e.g., 1, 2, 1, 2, 1, 2, 1, 2 . . . , and vertically in columns, e.g., 1, 3, 1, 3, 1, 3 . . . , phase mask 500 includes all of the phase shifts horizontally in each row, e.g., 3, 1, 4, 2, 3, 1, 4, 2 . . . , and vertically in each column, e.g., 3, 2, 1, 4, 3, 2 . . . . Thus, phase mask 500 has repeating groups of pixels with different phase shifts in both the horizontal and vertical directions. The layout of pixels in phase mask 500 has vertical and horizontal groups of pixels that are one pixel wide and that include all N phase shifts (e.g., N=4).

It should be understood that, while phase mask 500 is illustrated as using four different phase shifts, e.g., N=4, a smaller number, i.e., three, or a larger number of phase shifts may be used if desired. By way of example, the surface height z may be determined using three known phase shifts, and the phase mask 500 repeating groups of pixels with three different phase shifts in both the horizontal and vertical directions. For example, with three samples ($S_i$, i=1,2,4), the surface height z may be determined from:

$$\tan(kz) = 2\left(\frac{S_4 - S_1}{S_4 - S_2}\right) - 1. \qquad \text{eq. 2}$$

Using four pixels with different phase shift (N=4) is advantageous with square layouts and provides for some noise reduction over the three-pixel solution even with single row or column layouts.

FIG. 5B, by way of example, illustrates the phase mask 500 with four pixel groups in vertical columns that are one pixel wide (1×4) identified with dark boxes 502, 504, 506, and 508. It should be understood that the pixel groups are repeated in each column over the entire pixel array (but only a portion of the phase mask 500 is shown in FIG. 5B). As can be seen, each of the columns 502, 504, 506, and 508 includes all four phase shifts, and thus, permit the use of equation 1, to determine the average height z of the four pixels within any 1 pixel wide column. By shifting one pixel along a selected grouping of pixels, e.g., shifting box 502 downward one pixel, a new grouping of pixels is formed from which a new surface height z result may be determined, using three pixels from the previous grouping plus one new pixel, thereby producing a unique result at pixel single spacing.

Figures 5D, 5E:
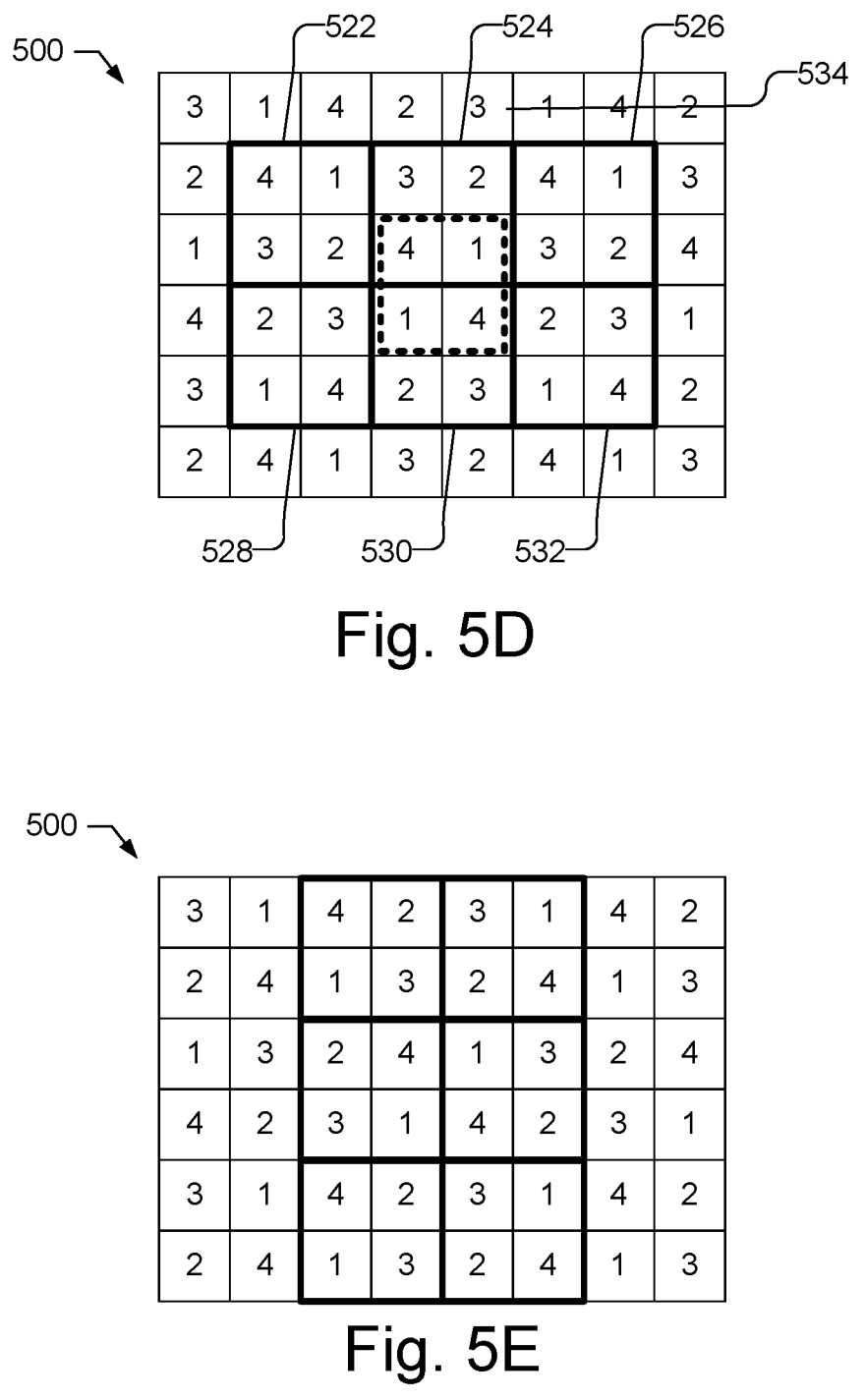

FIG. 5C illustrates the phase mask 500 with four pixel groups in horizontal rows that are one pixel high (4×1) rows identified with dark boxes 512, 514, 516, and 518. It should be understood that the pixel groups are repeated in each row over the entire pixel array (but only a portion of the phase mask 500 is shown in FIG. 5C). As can be seen, each of the rows 512, 514, 516, and 518 includes all four phase shifts, and thus, permit the use of equation 1, to determine the average height Z of the four pixels within any 1 pixel high row. Similar to the discussion above, by shifting one pixel along a selected grouping of pixels, e.g., shifting box 512 to the right one pixel, a new grouping of pixels is formed from which a new surface height z result may be determined, using three pixels from the previous grouping plus one new pixel, thereby producing a unique result at pixel single spacing Additionally, with phase mask 500 may include blocks that include pixels in multiple rows and columns, e.g., 2×2 pixels, are available. For example, FIG. 5D illustrates the phase mask with 2×2 pixel groupings identified with dark boxes 522, 524, 526, 528, 530, and 532. It should be understood that the pixel block groups are repeated over the entire pixel array (but only a portion of the phase mask 500 is shown in FIG. 5D). FIG. 5E similarly illustrates the phase mask with different 2×2 pixel groupings. As each 2×2 grouping includes all four phase shifts, equation 1 may be used to determine the average height Z of the four pixels within the 2×2 grouping. It is noted, however, that due to the configuration of pixels in phase mask 500, 2×2 groupings of pixels are not available with single pixel spacings. For example, as identified by the dotted line box 534 in FIG. 5D, there are 2×2 groupings in phase mask 500 that do not include all four phase shifts, and accordingly, equation 1 cannot be used to determine the average height Z of the four pixels in the 2×2 grouping 534. The loss of single pixel spacing for the 2×2 groupings in phase mask 500, however, is acceptable as all unique 2×2 groupings of pixels are available and phase mask 500 provides access to single pixel wide columns and single pixel high rows.

Thus, the phase mask 500, with all phase shifts expressed in horizontal groupings that are one pixel wide and in vertical groupings that are one pixel high, advantageously, permits selection of the pixel grouping to match the predominant orientation of a pattern on the sample at any location. The orientation of groupings may be selected to change from horizontal (4×1) to vertical (1×4) to blocks, e.g., (2×2) within a single image. Moreover, selection of the orientation of groupings occurs after the image is captured and advantageously avoid the need to re-acquire data, which improves throughput.

Figure 5F:
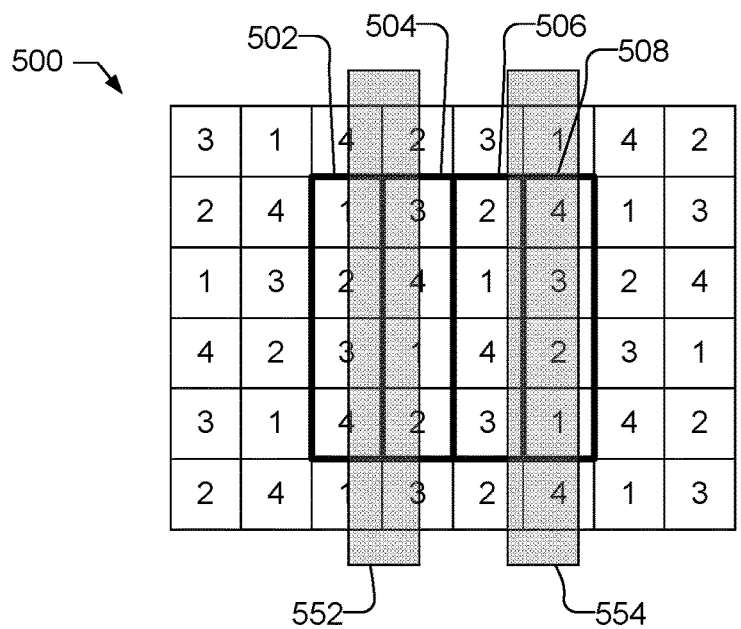

FIG. 5F, by way of example, illustrates the phase mask 500 with vertical lines 552 and 554 imaged from the sample superimposed onto the phase mask 500. The vertical lines 552 and 554, for example, represent changes in pattern density on the sample that are resolved by the tool. While phase mask 400, shown in FIG. 4C was not able to measure similar vertical lines, the pixel groupings of phase mask 500 can advantageously be modified to match the orientation of the pattern, e.g., the vertical lines 552 and 554. For example, as illustrated in FIG. 5F, vertical columns that are one pixel wide (1×4) with dark boxes 502, 504, 506, and 508 may be selected. Thus, in the example illustrated in FIG. 5F, all four pixels of the pixel grouping 502 detect the same part of the left edge of the vertical line 552. Similarly, all four pixels of the pixel group 504 detect the same part of the right edge of the vertical line 552. All four pixels in each pixel groupings 506 and 508 similarly detect the same part of the left edge and right edge, respectively, of the vertical line 554. The optical image of the lines is the same in all four pixels in the one pixel wide vertical pixel groupings and, accordingly, the effect of the pattern on the phase mask 500 is the same. Thus, equation 1 may be used to extract the average surface height Z for the pixels in these groupings, and accordingly, the measured height of vertical lines 552 and 554 is more accurate than the measured height of vertical lines 422 and 424 in FIG. 4C, allowing defects to be more readily detected. The system resolution is improved to the size of one pixel in the direction of highest pattern information content, at the expense of reduced resolution along the direction with no content. If desired, the resolution along this direction may be improved by using data from three pixel groups and equation 2.

Figure 5G:
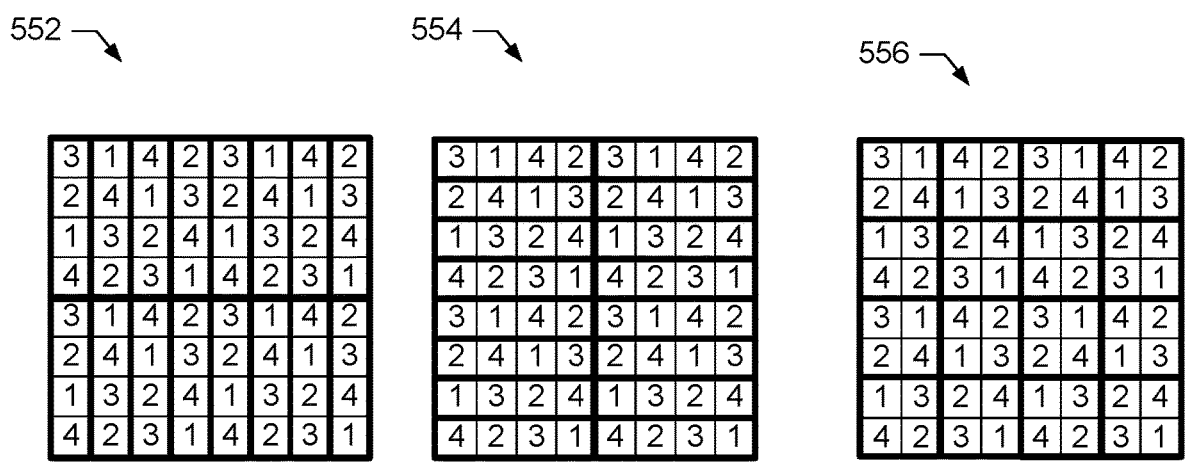

Thus, the phase mask 500 allows optimization of the analysis to the pattern on the sample. FIG. 5G, by way of example, illustrates possible selection of repeating vertical linear groups of pixels 552, repeating horizontal linear groups of pixels 554, and repeating block groups of pixels 556. It should be understood that in practice, it is the groups of interleaved interferograms imaged by the detector array 158 that are selected for analysis. Different parts of the same image may be optimized differently, e.g., by selecting different vertical, horizontal, or blocks (e.g., 2×2) groupings of pixels, or multiple analysis schemes can be applied to the same area, all without the need to reacquire the image data. Further, the phase mask 500 improves the resolution along pattern directions by a factor of two over the current 2×2 phase mask layout, e.g., phase mask 400.

Figure 6:
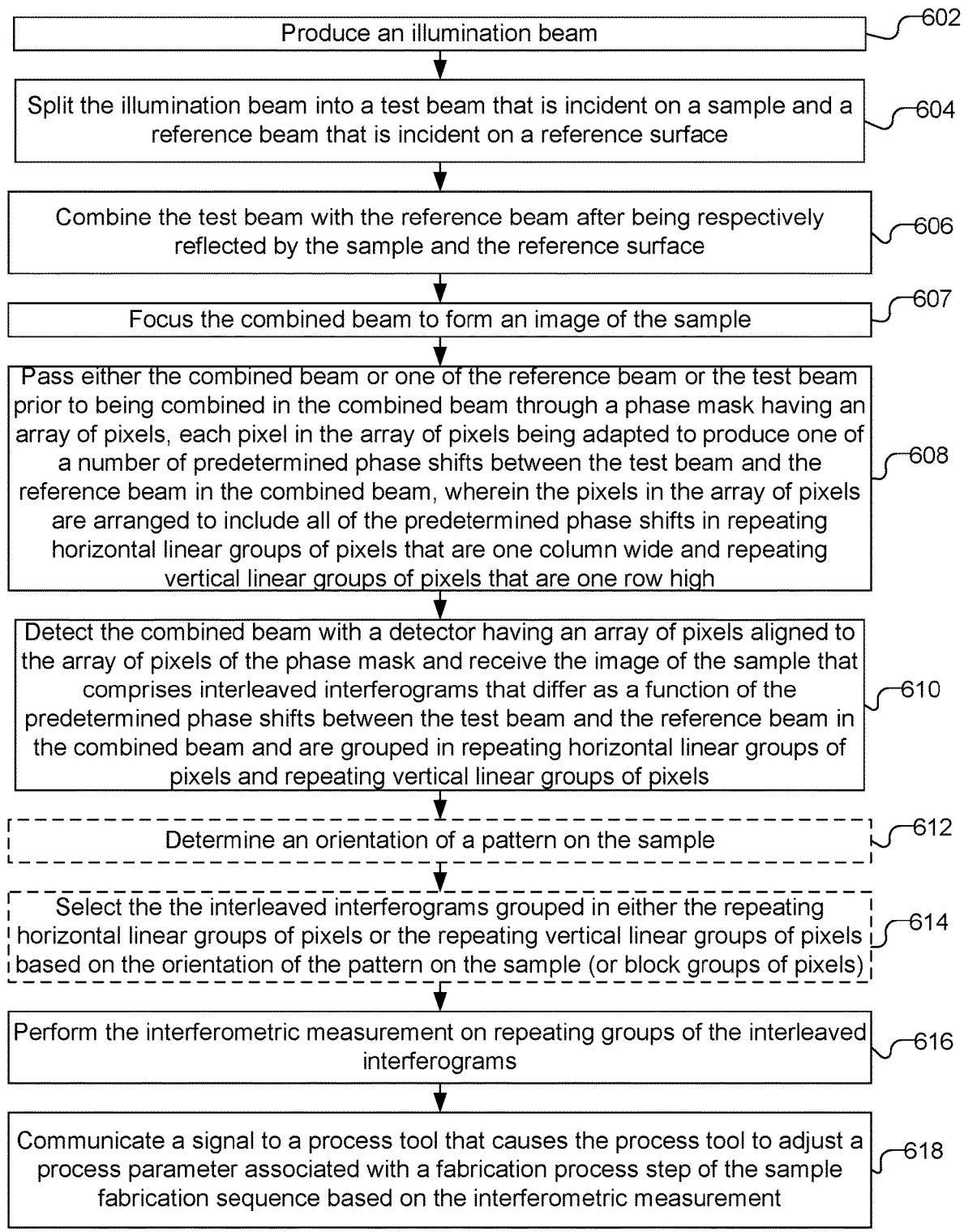
FIG. 6 illustrates a flow chart of a method of performing an interferometric measurement with a phase shift mask with a pixel arrangement, e.g., as illustrated in FIGS. 5A-5G.

FIG. 6 by way of example, is a flow chart illustrating a method of performing an interferometric measurement, e.g., using an interferometer 100, 100' shown in FIGS. 1 and 2, with a phase shift mask having an arrangement, e.g., as illustrated in FIGS. 5A-5G. As illustrated, an illumination beam is produced (602), e.g., by the light source 110. The illumination beam is split into a test beam that is incident on a sample and a reference beam that is incident on a reference surface (604), e.g., with the interferometric objective lens system 130, for example using the polarizing beam splitter 132. The test beam with the reference beam are combined after being respectively reflected by the sample and the reference surface (606), e.g., with the with the interferometric objective lens system 130, for example using the polarizing beam splitter 132. The combined beam is focused to form an image of the sample (607), e.g., with the lens system 152.

Either the combined beam or one of the reference beam or the test beam prior to being combined in the combined beam is passed through a phase mask having an array of pixels, each pixel in the array of pixels being adapted to produce one of a number of predetermined phase shifts between the test beam and the reference beam in the combined beam, wherein the pixels in the array of pixels are arranged to include all of the predetermined phase shifts in repeating horizontal linear groups of pixels that are one column wide and repeating vertical linear groups of pixels that are one row high (608). For example, the phase mask may be phase mask 155 and 500 illustrated in FIGS. 1, 2 and 5A-5G. The phase mask may be positioned so that the combined beam passes through the phase mask and the pixels in the phase mask are linear polarizers having one of the number of polarizer orientations to produce the predetermined phase shifts between the test beam and the reference beam. Alternatively, the phase mask may be positioned so that one of the reference beam or the test beam prior to being combined in the combined beam passes through the phase mask and the pixels in the phase mask are phase delay elements having one of the number of phase delays to produce the predetermined phase shifts between the test beam and the reference beam.

The combined beam is detected with a detector having an array of pixels aligned to the array of pixels of the phase mask and placed in a plane of the image of the sample to receive the image of the sample that comprises interleaved interferograms that differ as a function of the predetermined phase shifts between the test beam and the reference beam in the combined beam and are grouped in repeating horizontal linear groups of pixels and repeating vertical linear groups of pixels (610). For example, the detector may be detector array 158 illustrated in FIGS. 1 and 2. Interferometric measurements are performed on repeating groups of the interleaved interferograms (616). A signal may be communicated to a process tool that causes the process tool to adjust a process parameter associated with a fabrication process step of the sample fabrication sequence based on the interferometric measurement of the sample (618). Thus, the resulting measurement may be used to modify, alter, or inform further processing of the test sample or the processing of subsequently processed samples, e.g., in a feed forward or feedback process. In this regard, measurement results may be exported to another system. By way of example and not limitation, after receiving the data, a Lithography process tool may alter its focal position(s) used on the test sample or subsequent samples or a CMP polishing tool may change parameters, such as the duration and pressure, applied during the polishing process of subsequent samples or the same test sample if taken back for additional polishing. In some implementations, a signal may be communicated to cause at least a portion of the sample, e.g., a die of a wafer, to be rejected based on the presence of the defect in the test region of interest on the sample. For example, an indication of the presence of a defect may be associated with the sample, or at least a portion of the sample, e.g., a die with a defect, and the indication of the presence of the defect may be recalled and used to reject the sample or portion of the sample, e.g., by excluding the sample or portion of the sample, from the finished lot at the completion of processing of the sample. Thus, the detection of a defect may be used to modify, alter, or inform further processing of the test sample, e.g., in a feed forward process. In this regard, the inspection results may be exported to another system. In some implementations, the signal indicates the presence of a defect may be stored in memory, and the population of defects in memory may be used by yield engineers to drive yield improvements and control yield excursions In some implementations, as indicated with dashed block 612 and 614, the method may include determining an orientation of a pattern in a portion of the sample (612). For example, the orientation of the pattern may be informed by a user or the known processing design of the sample. Alternatively, the orientation of the pattern may be measured, e.g., as part of the processing of image data (because the pattern is resolvable by the interferometer 100, 100') or by another metrology tool. The interleaved interferograms grouped in either the repeating horizontal linear groups of pixels or the repeating vertical linear groups of pixels may be selected for the interferometric measurement of the portion of the sample based on the orientation of the pattern in the portion of the sample (614). For example, as illustrated in FIG. 5F, if the pattern on the sample are lines on the sample having a horizontal orientation or a vertical orientation in the portion of the sample, the interleaved interferograms in either the repeating horizontal linear groups of pixels or the repeating vertical linear groups of pixels based on the orientation of the pattern in the portion of the sample are selected to match the horizontal orientation or the vertical orientation of the lines in the portion of the sample. In some implementations, the pixels in the array of pixels are arranged to further include all of the predetermined phase shifts in repeating block groups of pixels that include pixels in multiple rows and columns, e.g., as illustrated by the blocks shown in FIGS. 5D and 5E. In some implementations, it may be determined that a portion of the sample does not have a resolved pattern, and the interleaved interferograms grouped in repeating block groups of pixels may be selected for the interferometric measurement of the portion of the sample (614). It should be understood that a single image of the sample may include multiple portions having different orientations of patterns and/or having unresolved patterns, and that a different selection of groups of pixels (e.g., vertically linear groups, horizontally linear groups or block groups) may be made for each portion of the image.

In one implementation, the interferometric measurement may produce an average surface height for the pixels in each group of the interleaved interferograms, e.g., as discussed in reference to equations 1 and 2.

In one implementation, the method may further include detecting a defect on the sample using the interferometric measurement, wherein the signal communicated to the process tool is based on the detected defect. For example, a defect may be detected by comparing the measured height of the sample surface to a measured height of one or more reference surfaces. For example, a defect may be detected by determining a surface height of the sample surface at one or more detected pixels and performing a pixel-to-pixel comparison of the surface height to measured surface heights at one or more different locations on the sample surface or to a golden sample surface, which have same nominal design, and determining the presence of a defect if the difference in surface height of the compared regions exceeds a threshold. Defect detection is described further in the U.S. patent application Ser. No. 16/197,737, entitled "Sub-Resolution Defect Detection," filed Nov. 21, 2018, and in the U.S. patent application Ser. No. 16/197,849, entitled "Sample Inspection Using Topography," filed Nov. 21, 2018, both of which are herein incorporated by reference in their entireties.

In one implementation, the method may further include determining a roughness of the sample using the interferometric measurement, wherein the signal communicated to the process tool is based on the roughness of the sample. For example, the roughness of the sample may be determined by, e.g., determining a surface height for a neighborhood of pixels around each target pixel and calculating a standard deviation for the target pixel. The result is an image where the value at each pixel indicates the local roughness over the neighborhood.

In one implementation, the method may further include determining a characteristic of a feature on the sample using the interferometric measurement, wherein the signal communicated to the process tool is based on the characteristic of the feature. For example, a topography of the sample may be generated using the interferometric measurements, from which characteristics such as critical dimension, line width, sidewall angle, film thickness, dishing, bow, warp, etc. may be determined.

Figure 7:
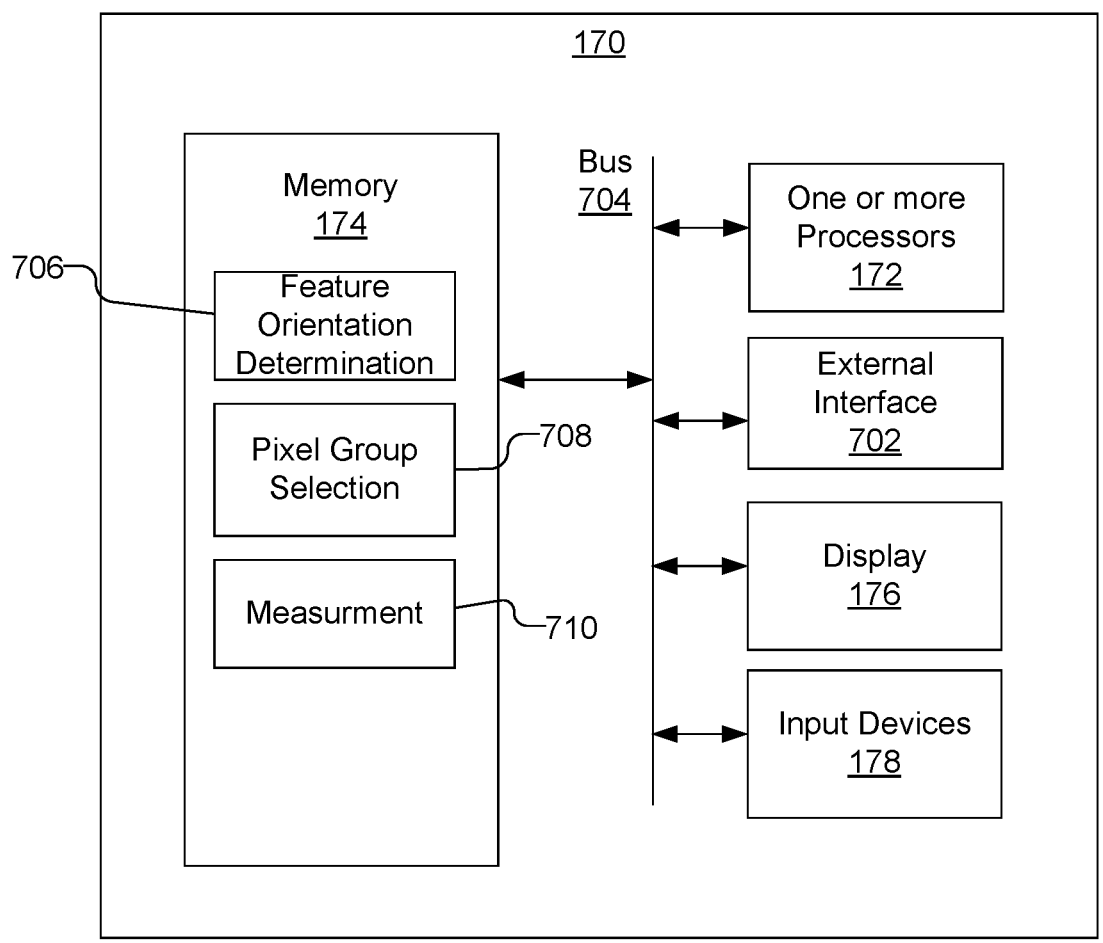
FIG. 7 is a diagram illustrating an example of a hardware implementation of a computer system, which may be used with an interferometer having a phase shift mask with a pixel arrangement, e.g., as illustrated in FIGS. 5A-5G.

FIG. 7 is a diagram illustrating an example of a hardware implementation of a computer system 170, used with interferometers 100, 100' shown in FIGS. 1 and 2. The computer system 170 includes, e.g., hardware components such as an external interface 702, which may be a wired or wireless interface capable of connecting to receive data from the camera 150 and to provide control signals to the stage 144 or export defect data. The computer system 170 further includes a user interface including e.g., the display 176 and input devices 178. The computer system 170 further includes one or more processors 172 and memory 174, which may be coupled together with bus 704. The one or more processors 172 and other components of the computer system 170 may similarly be coupled together with bus 704, a separate bus, or may be directly connected together or a combination of the foregoing.

The memory 174 may contain executable code or software instructions that when executed by the one or more processors 172 cause the one or more processors to operate as a special purpose computer programmed to perform the algorithms disclosed herein. For example, as illustrated in FIG. 7, the memory 174 includes one or more components or modules that when implemented by the one or more processors 172 implements the methodologies as described herein. While the components or modules are illustrated as software in memory 174 that is executable by the one or more processors 172, it should be understood that the components or modules may be dedicated hardware either in the processor or off processor.

As illustrated, the memory 174 may include a feature orientation determination unit 706 that when implemented by the one or more processors 172 causes the one or more processors 172 to determine or obtain the orientation of any resolvable patterns on the sample, e.g., using the acquired image data from the interferometer 100, 100'. As discussed above, the orientation of the features may also be obtained from a user or the known process design associated with the sample, along with additional information, such as the known orientation the sample placement with respect to the chuck 142. The orientation of the features may alternatively be determined from measurements from a different metrology tool.

The memory 174 may further include a pixel group selection unit 708 that when implemented by the one or more processors 172 causes the one or more processors 172 to select repeatable pixel groups of the phase mask, e.g., in rows that are one column wide or columns that are one row high, or in blocks of pixels, to be used for the interferometric measurement based on the orientation of the pattern on the sample. For example, if the feature orientation determination unit 706 determines that the patterns are oriented horizontally then horizontal linear groups of pixels may be selected, if the patterns are oriented vertically then vertically linear groups of pixels may be selected, and if no patterns are resolvable then one or more of block groups of pixels, horizontal linear groups of pixels, or vertical linear groups of pixels may be selected.

The memory 174 may include a measurement unit 710 that when implemented by the one or more processors 172 causes the one or more processors 172 to perform the interferometric measurements using the predetermined phase shifts in the repeating pixel groups from the signals received from the camera 150. The measurement unit 710, for example, may cause the one or more processors 172 to measure an average surface height for the pixels in each repeatable pixel groups, e.g., to determine a topography of the sample. The measurement unit 710 may further cause the one or more processors to use the interferometric measurement to detect defects on the sample, detect roughness of the surface of the sample, or determine a characteristic of a feature on the sample using the interferometric measurement, such as critical dimension, line width, sidewall angle, film thickness, dishing, bow, warp, etc. If the measurement unit 710 is performing a comparison of the measured height of the sample surface to a measured height of one or more reference surfaces, e.g., to detect a defect, the reference surfaces should have the same orientation as the sample surface and the same pixel group selection, e.g., horizontal linear groups of pixels, vertical linear groups of pixels, or block groups of pixels, should be used for the reference surfaces as used for the sample surface. The methodologies described herein may be implemented by various means depending upon the application. For example, these methodologies may be implemented in hardware, firmware, software, or any combination thereof. For a hardware implementation, the one or more processors may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For an implementation involving firmware and/or software, the methodologies may be implemented with modules (e.g., procedures, functions, and so on) that perform the separate functions described herein. Any machine-readable medium tangibly embodying instructions may be used in implementing the methodologies described herein. For example, software codes may be stored in a memory and executed by one or more processor units, causing the processor units to operate as a special purpose computer programmed to perform the algorithms disclosed herein. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a non-transitory computer-readable storage medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable storage medium, instructions and/or data may be provided as signals on transmission media included in a communication apparatus. For example, a communication apparatus may include a transceiver having signals indicative of instructions and data. The instructions and data are stored on non-transitory computer readable media, e.g., memory 174, and are configured to cause the one or more processors to operate as a special purpose computer programmed to perform the algorithms disclosed herein. That is, the communication apparatus includes transmission media with signals indicative of information to perform disclosed functions.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A phase shift interferometer comprising:
   a phase mask positioned for either a reference beam or a test beam prior to pass through before being combined in a combined beam or for the combined beam to pass through, the phase mask having an array of pixels, each pixel in the array of pixels being adapted to produce one of a number of predetermined phase shifts between the test beam and the reference beam in the combined beam, wherein the pixels in the array of pixels are arranged to include all of the predetermined phase shifts in repeating horizontal linear groups of pixels that are one column wide and repeating vertical linear groups of pixels that are one row high;
   a detector positioned in a plane of an image of a sample to receive the combined beam, the detector comprising an array of pixels aligned to the array of pixels of the phase mask and that receive the image of the sample that comprises interleaved interferograms that differ as a function of the predetermined phase shifts between the test beam and the reference beam in the combined beam and are grouped in repeating horizontal linear groups of pixels and repeating vertical linear groups of pixels; and
   at least one processor coupled to the detector, the at least one processor configured to receive signals for each pixel in the array of pixels in the detector and is configured to perform an interferometric measurement based on repeating groups of the interleaved interferograms.

2. The phase shift interferometer of claim 1, wherein the at least one processor is further configured to:
   determine an orientation of a pattern in a portion of the sample; and
   select for the interferometric measurement of the portion of the sample the interleaved interferograms grouped in either the repeating horizontal linear groups of pixels or the repeating vertical linear groups of pixels based on the orientation of the pattern in the portion of the sample.

3. The phase shift interferometer of claim 2, wherein the pattern on the sample are lines having a horizontal orientation or a vertical orientation in the portion of the sample, and wherein the interleaved interferograms in either the repeating horizontal linear groups of pixels or the repeating vertical linear groups of pixels based on the orientation of the pattern in the portion of the sample are selected to match the horizontal orientation or the vertical orientation of the lines in the portion of the sample.

4. The phase shift interferometer of claim 1, wherein the pixels in the array of pixels are arranged to further include all of the predetermined phase shifts in repeating block groups of pixels that include pixels in multiple rows and columns, and wherein the at least one processor is further configured to:
   determine a portion of the sample does not have a resolved pattern; and
   select for the interferometric measurement of the portion of the sample the interleaved interferograms grouped in the repeating block groups of pixels.

5. The phase shift interferometer of claim 1, wherein the phase mask is positioned to receive the combined beam and the pixels in the phase mask are linear polarizers having one of a number of polarizer orientations to produce the predetermined phase shifts between the test beam and the reference beam.

6. The phase shift interferometer of claim 1, wherein the phase mask is positioned to receive the one of the reference beam or the test beam prior to being combined in the combined beam and the pixels in the phase mask are phase delay elements having one of a number of phase delays to produce the predetermined phase shifts between the test beam and the reference beam.

7. The phase shift interferometer of claim 1, wherein the at least one processor is further configured to communicate a signal to a process tool that causes the process tool to adjust a process parameter associated with a fabrication process step of a sample fabrication sequence based on the interferometric measurement.

8. The phase shift interferometer of claim 1, wherein the interferometric measurement produces an average surface height for the pixels in each repeatable pixel group.

9. The phase shift interferometer of claim 1, wherein the at least one processor is further configured to use the interferometric measurement to at least one of detect a defect on the sample, a roughness of the sample, and a characteristic of a feature on the sample.

10. A phase shift interferometer comprising:
means for producing one of a plurality of predetermined phase shifts between a test beam that is incident on a sample and a reference beam that is incident on a reference surface and are combined to produce a combined beam, wherein all of the plurality of the predetermined phase shifts occur in an array of pixels with repeating horizontal linear groups of pixels that are one column wide and repeating vertical linear groups of pixels that are one row high;
means for detecting an image of the sample from the combined beam as interleaved interferograms that differ as a function of the predetermined phase shifts between the test beam and the reference beam in the combined beam and are grouped in repeating horizontal linear groups of pixels and repeating vertical linear groups of pixels; and
means for performing an interferometric measurement based on the interleaved interferograms based on received signals from each pixel in the array of pixels.

11. The phase shift interferometer of claim 10, wherein the plurality of predetermined phase shifts comprises a number (N), the horizontal linear groups of pixels are 1×N pixels and the vertical linear groups of pixels are N×1 pixels.

12. The phase shift interferometer of claim 10, wherein the means for performing the interferometric measurement is configured to:
select the interleaved interferograms grouped in the repeating horizontal linear groups of pixels and the repeating vertical linear groups of pixels;
perform the interferometric measurement on the selected interleaved interferograms;
determine an orientation of a pattern in a portion of the sample; and
select the interleaved interferograms grouped in the repeating horizontal linear groups of pixels and the repeating vertical linear groups of pixels by being configured to select the interleaved interferograms based on the orientation of the pattern in the portion of the sample.

13. The phase shift interferometer of claim 12, wherein the pattern in the portion of the sample are lines having a horizontal orientation or a vertical orientation on the sample, and the interleaved interferograms are selected to match the orientation of the lines on the sample.

14. The phase shift interferometer of claim 10, wherein the means for performing the interferometric measurement is configured to:
select the interleaved interferograms grouped in the repeating horizontal linear groups of pixels and the repeating vertical linear groups of pixels;
perform the interferometric measurement on the selected interleaved interferograms;
determine a portion of the sample does not have a resolved pattern; and
select the interleaved interferograms grouped in the repeating horizontal linear groups of pixels and the repeating vertical linear groups of pixels by being configured to select repeating groups of pixels in the portion of the sample based on the portion of the sample not having a resolved pattern.

15. The phase shift interferometer of claim 10, wherein the means for producing one of the plurality of predetermined phase shifts is positioned to receive the combined beam and the pixels in the in the array of pixels are linear polarizers having one of a number of polarizer orientations to produce the predetermined phase shifts between the test beam and the reference beam.

16. The phase shift interferometer of claim 10, wherein the means for producing one of the plurality of predetermined phase shifts is positioned to receive the one of the reference beam or the test beam prior to being combined in the combined beam and the pixels in the in the array of pixels are phase delay elements having one of a number of phase delays to produce the predetermined phase shifts between the test beam and the reference beam.

17. The phase shift interferometer of claim 10, wherein the means for performing the interferometric measurement is configured to communicate a signal to a process tool that causes the process tool to adjust a process parameter associated with a fabrication process step of a sample fabrication sequence based on the interferometric measurement.

18. The phase shift interferometer of claim 10, wherein the interferometric measurement produces an average surface height for the pixels in each repeatable group of pixels.

19. The phase shift interferometer of claim 10, wherein the means for performing the interferometric measurement is configured to use the interferometric measurement to at least one of detect a defect on the sample, a roughness of the sample, and a characteristic of a feature on the sample.

* * * * *